(12) United States Patent
Moore et al.

(10) Patent No.: US 7,518,831 B2
(45) Date of Patent: Apr. 14, 2009

(54) LOW IMPEDANCE FLEXIBLE CIRCUIT FOR TAPE HEAD

(75) Inventors: John Leland Moore, Solvang, CA (US); Matthew Clarke Barsotti, Santa Maria, CA (US)

(73) Assignee: Certance LLC, San Jose, CA (US)

( * ) Notice: Subject to any disclaimer, the term of this patent is extended or adjusted under 35 U.S.C. 154(b) by 479 days.

(21) Appl. No.: 11/243,712

(22) Filed: Oct. 4, 2005

(65) Prior Publication Data

US 2007/0076324 A1  Apr. 5, 2007

(51) Int. Cl.
*G11B 5/008* (2006.01)

(52) U.S. Cl. .................................................. 360/261.1

(58) Field of Classification Search ............... 360/261.1, 360/264.2, 266.3, 271.9, 245.8, 245.9
See application file for complete search history.

(56) References Cited

U.S. PATENT DOCUMENTS

| | | | | |
|---|---|---|---|---|
| 5,754,369 A | * | 5/1998 | Balakrishnan | 360/264.2 |
| 5,812,344 A | * | 9/1998 | Balakrishnan | 360/245.9 |
| 6,737,589 B2 | * | 5/2004 | Adachi et al. | 174/254 |
| 7,079,357 B1 | * | 7/2006 | Kulangara et al. | 360/245.9 |
| 7,116,522 B2 | * | 10/2006 | Poorman | 360/241 |
| 2003/0116343 A1 | * | 6/2003 | Adachi et al. | 174/254 |
| 2004/0070884 A1 | * | 4/2004 | Someya et al. | 360/245.9 |

* cited by examiner

*Primary Examiner*—Angel A. Castro
(74) *Attorney, Agent, or Firm*—Baker Botts L.L.P.

(57) ABSTRACT

A dual layer flexible circuit for tape drives is provided that has a flexible substrate with first and second sides. A plurality of write trace pairs are provided on the substrate, with each write trace pair including a first write trace on the first side of the substrate and a second write trace on the second side of the substrate opposing the first write trace. Each first write trace has a width that is narrower than the width of each second write trace, thereby allowing for compensation of misalignment between the trace layers, avoiding variation in the capacitance and inductance of the full circuit.

19 Claims, 3 Drawing Sheets

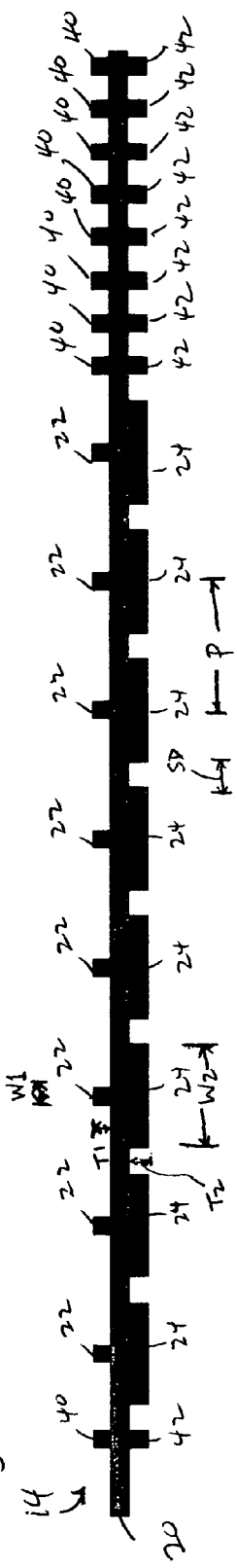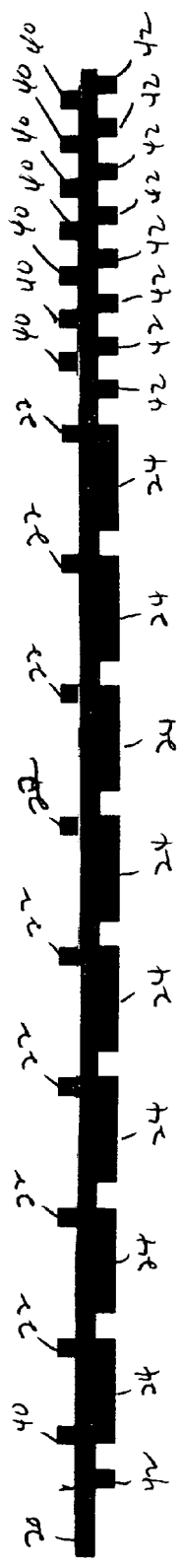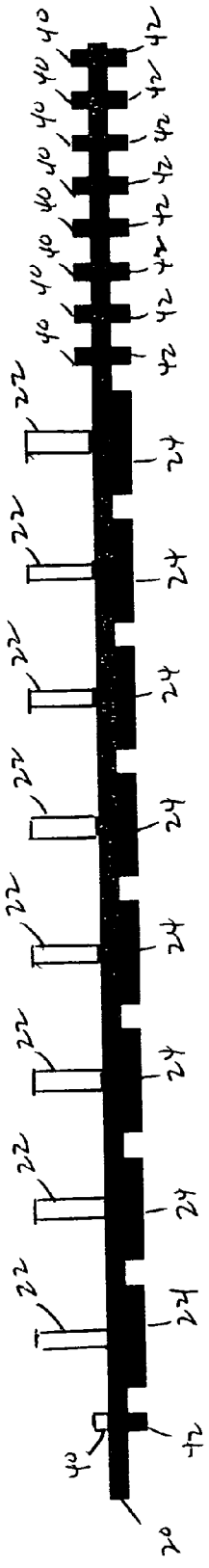

LOW IMPEDANCE FLEXIBLE CIRCUIT FOR TAPE HEAD

FIELD OF THE INVENTION

The present invention relates to flexible circuits connecting magnetic heads to read and write circuits of a magnetic recording device, and more particularly, to a dual layer flexible circuit for a multi-channel tape head.

BACKGROUND OF THE INVENTION

Magnetic tape drives are typically employed to provide data backup and archival storage for user data records and programs. For digital data storage applications, tape drives typically employ either rotating heads, or non-rotating heads. One form of non-rotating head is the streaming tape drive. In a streaming tape drive, multiple blocks of user data are typically written to tape in a single streaming operation, rather than in a series of start-stop operations of the tape transport. In the streaming tape drive, a magnetic tape head includes at least one write/read element. The head is typically positioned laterally relative to the tape path by a lead screw, which is controllably rotated by, e.g., a stepper motor, or an equivalent arrangement. In this manner, a single transducer element, or several spaced-apart elements, may write to, and read from, a multiplicity of linear tracks defined along the magnetic recording tape.

In order to permit the head to be moved laterally across the tape in order to confront the multiple parallel tape tracks, a flexible head interconnector arrangement is needed to connect the write/read elements of the head to electronic circuitry conventionally mounted on one or more printed circuit boards affixed to the tape drive base or housing. In the past, flexible wires, twisted together into pairs and gathered into a cable, have been employed as tape head interconnects.

Data rates and track densities are increasing. One way to increase the data rate of a magnetic recording system is to increase the write frequency. Another way to increase data rate is to increase the number of parallel write and read elements of the head and data channels of the tape drive so that more tracks are simultaneously written during each tape streaming operation.

A further way to increase track density is to reduce the linear track width and spacing by aligning the write elements/read elements closer together. By employing thin film inductive write elements and magneto-resistive read elements, it is practical to increase the number of data tracks. Since the head carrying the write and read elements must still be displaced laterally relative to the tape path, a flexible interconnect arrangement is needed in order to connect the write and read elements of the movable head to the write and read electronics affixed to the printed circuit board of the drive electronics.

Write system bandwidth is one of the constraints in achieving higher data rates in high-performance tape drives. One approach to improve the write system bandwidth and rise time is to reduce the parasitic inductance and impedance of the write system by using a two-layer flexible circuit design, with write trace pairs stacked on top of each other, using both trace layers of a dual layer flexible circuit. This configuration results in higher capacitance, but much lower inductance compared with the more traditional layout with write trace pairs on the same trace layer. The lower inductance allows for much faster write current rise time response, which enables the higher system bandwidth and transfer rates needed for higher performance tape drive systems.

FIGS. 3A and 3B depict a dual layer flexible circuit employing paired traces on the layers to illustrate a concern with such arrangements. FIG. 3A shows a plurality of write trace pairs formed on a dual layer flexible circuit. Each write trace pair includes a first write trace 50 and an opposing second write trace 52 formed on opposite sides of a substrate 51. The first and second write traces 50, 52 of a write trace pair are of similar dimensions and formed of copper electrodeposited upon the substrate 51, for example. The structure of FIG. 3A depicts an ideal alignment of the first and second write traces 50, 52 in the two layers. In practice, however, the use of paired traces on two layers of a flexible printed circuit can be inhibited by variation in the layer-to-layer alignment of the traces. See, for example, FIG. 3B which depicts an exemplary dual layer flexible circuit with a misalignment of the trace layers. As can be seen, variation in the alignment of the two traces between the layers changes the effective separation between the write traces. This variation in the alignment of the two traces between the layers will produce variations in the capacitances and inductance of the full circuit, which is an undesirable result. In high performance multi-channel tape drives, there will also be multiple pairs of write traces, and layer to layer alignment variation also presents a challenge in maintaining low crosstalk between adjacent pairs of write trace pairs.

One approach to compensate for this alignment issue is to use very wide circuit traces, along with very wide spaces between the traces of adjacent circuits, so that the effect of the layer-to-layer misalignment on capacitance, inductance and crosstalk is minimized. However, this approach results in a much larger overall width for the flexible circuit, presenting cost and mechanical integration challenges.

SUMMARY OF THE INVENTION

There is a need for providing a flexible circuit design that reduces the parasitic inductance and impedance of the write system, but without resulting in a larger overall width for the flexible circuit, or increasing the variation in the capacitance and inductance of the full circuit.

These and other needs are met by embodiments of the present invention which provide a dual layer flexible circuit comprising a first substrate having first and second sides, and a plurality of write trace pairs. Each write trace pair includes a first write trace on the first side of the substrate and a second write trace on the second side of the substrate opposing the first write trace. Each first write trace has a width that is narrower than the width of each second write trace.

By providing for the first write traces on the first side of the substrate to have widths narrower than the second write traces on the second side of the substrate, near constant capacitances, inductance and crosstalk characteristics may be maintained throughout the full range of a layer-to-layer alignment variation, while providing a minimal overall width for the flexible circuit.

The earlier stated needs are also met by other aspects of the present invention which provide a tape drive with a dual layer flexible circuit comprising a write/read head, and a dual layer flexible circuit coupled to the write/read head. This flexible circuit includes a flexible substrate having first and second sides, and plurality of write trace pairs. Each write trace pair includes a first write trace on the first side of the substrate and a second write trace on the second side of the substrate opposing the first write trace. Each first write trace has a width that is narrower than the width of each second write trace.

The earlier stated needs are also met by other embodiments of the present provide a invention which provide a data recording drive, comprising a write/read head and means for supplying write signals to the write/read head.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 4 shows a schematic depiction of a cross-section of a portion of a dual layer flexible circuit constructed in accordance with embodiments of the present invention, with an ideal alignment between the trace layers.

FIG. 5 depicts a dual layer flexible circuit constructed in accordance with embodiments of the present invention with maximally misaligned trace layers.

FIG. 6 depicts a cross-section of a portion of a dual layer flexible circuit constructed in accordance with other embodiments of the present invention.

DETAILED DESCRIPTION OF THE INVENTION

The present invention addresses and solves problems related to the achieving of higher data rates in tape drives and other recording devices, while maintaining near constant capacitance, inductance and crosstalk characteristics through the full range of layer-to-layer alignment variation in dual layer flexible circuits, while providing a minimum overall width of the flexible circuit. This is achieved, in part, by the present invention which provides a dual layer flexible circuit having different trace widths on the two layers of the flexible circuit. For example, in certain embodiments, each write trace pair includes a first write trace on the first side of a substrate and a second write trace on the second side of the substrate opposing the first write trace. Each first write trace has a width that is narrower than the width of each second write trace. In certain embodiments, the width of each of the second write traces is equal to the width of one of the first write traces plus twice an allowed misalignment amount between the trace layers.

Figure 1:
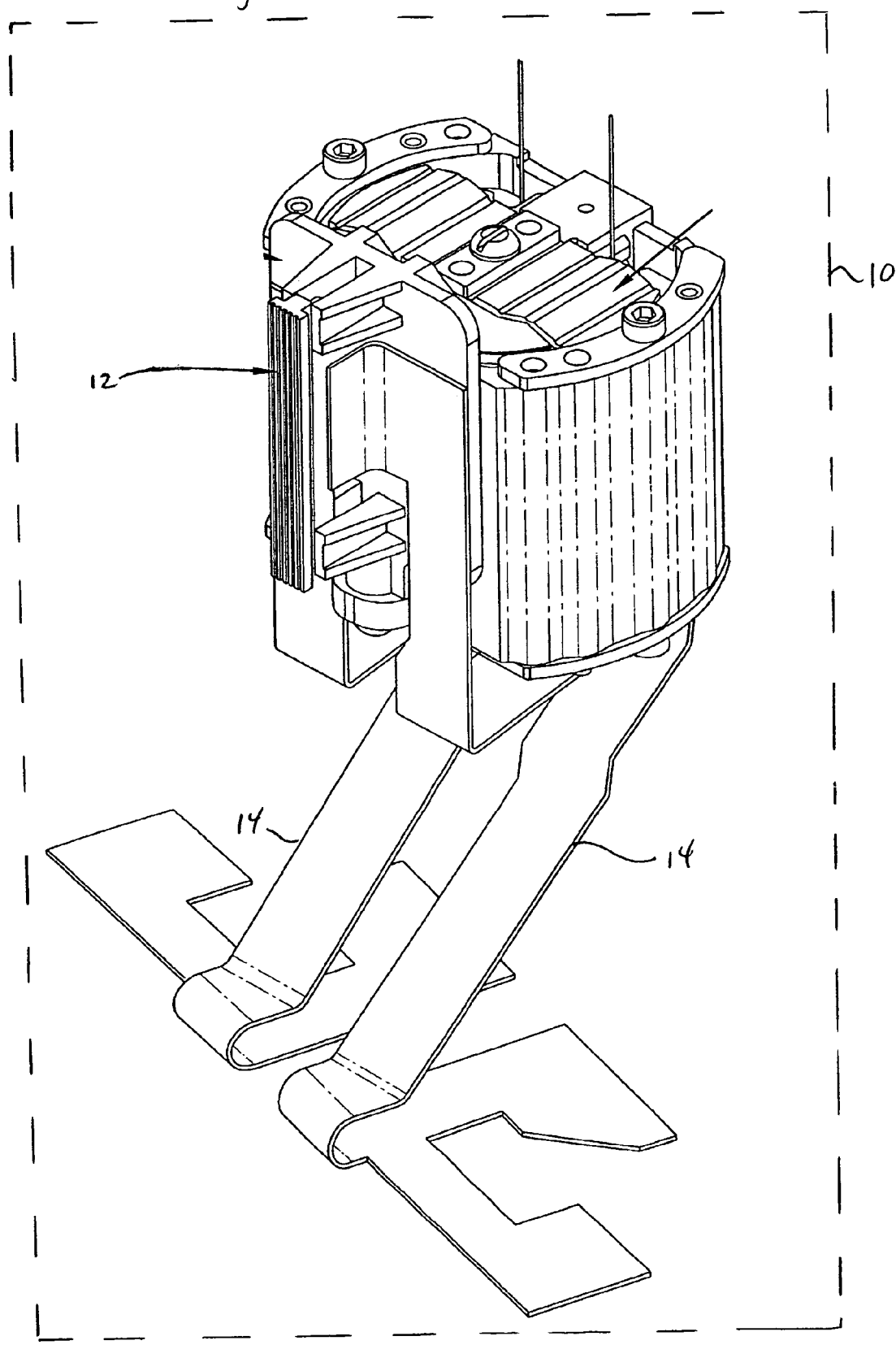
FIG. 1 is a depiction of a portion of a tape drive with flexible printed circuits constructed in accordance with embodiments of the present invention.

FIG. 1 shows a schematically indicated tape drive 10 (in dashed lines) having a write/read head 12 able to write on multiple channels. The write signals, as well as the read signals, are carried by a pair of flexible printed circuits 14. These flexible printed circuits 14 connect the write/read head 12 to the write and read circuits of a printed circuit board (not shown). The connections between the flexible printed circuits 14 and the write/read head 12 and the printed circuit board may be conventional in nature.

Figure 2:
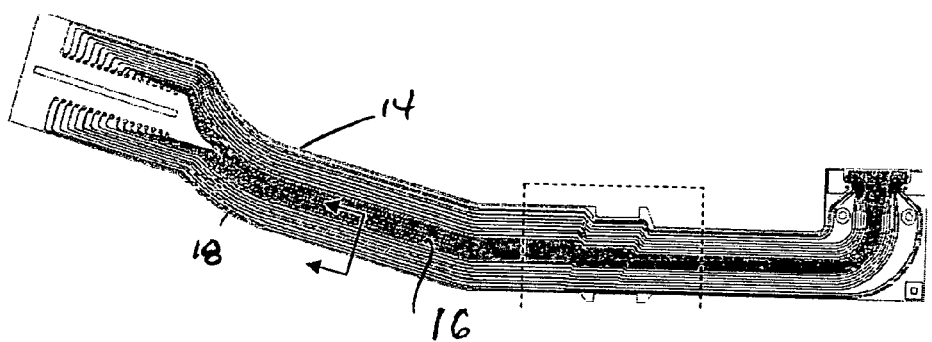
FIG. 2 is a top view of a flexible printed circuit in accordance with certain embodiments of the present invention.

A top view of an exemplary layout of one of the flexible printed circuits 14 is depicted in FIG. 2. A plurality of read trace pairs 16 are provided towards the center of the flexible printed circuit 14, for example. A plurality of write/trace pairs 18 are also provided on the flexible printed circuit 14. The number of read trace pairs 16 and the number of write trace pairs 18 can be varied depending upon the number of write/read channels in the tape drive 10. In the embodiment of FIG. 2, a total of sixteen write trace pairs 18, and sixteen read trace pairs 16 are provided. These numbers are exemplary only, however.

A schematic depiction of the cross section of a portion of the flexible printed circuit 14 is provided in FIG. 4. It should be recognized that the structures are not drawn to scale and in the depiction of the dual layer flexible circuit 14 of FIG. 4.

In the right hand side of FIG. 4, a plurality of read trace pairs are provided, each read trace pair including a first read trace 40 and a second read trace 42 opposing the first read trace 40. These read traces 40, 42 are provided on opposing sides of a substrate 20, which may be a plastic material such as polyamide. The read traces 40, 42, as well as the write traces, which will be described, may be formed of a copper that is electrodeposited on both sides of the substrate 20. A typical thickness of the substrate is approximately 25 microns, for example. In the embodiment of FIG. 4, the thickness T1 of the retraces 40, 42, and the write traces is between about 10 to about 20 microns, and more typically, 12 to 15 microns. A conventional electrodeposition methodology may be employed to form the traces.

A plurality of write trace pairs are provided in the embodiment of FIG. 4. As is apparent, different trace widths are provided on the dual layers of the flexible circuit 14. First write traces 22 are provided on the first side of the substrate 20, and second write traces 24 are provided on the second side of the substrate 20. Each write trace pair 18 consists of a first write trace 22 and a second write trace 24 opposing one another.

The depiction of FIG. 4 shows a dual layer flexible circuit with an ideal alignment in that each first write trace 22 is centered over one of the second write traces 24. Each of the second write traces 24 is separated from another one of the second write traces 24 by a separation distance SD, which is consistent for this trace layer due to the electrodeposition methodology. In certain embodiments of the invention, the separation distance SD is approximately 75 microns. The width W1 of the first write trace 22, in the embodiment of FIG. 4, is approximately 50 microns. The maximum allowable misalignment between the layers is also approximately 75 microns, so that it is desirable to form the second write traces 24 to have a width W2 that is equal to or greater than the width W1 of the first write trace 22 and twice the allowed misalignment amount so as to ensure that the first write trace 22 will be positioned over the corresponding second write trace 24. Hence, if the misalignment amount is 50 microns in the illustrated embodiment, and the allowed misalignment is 75 microns, the width W2 of the second write trace is at least 200 microns. In currently preferred embodiments of the invention, the first write trace 22 is 50 microns in width; the second write trace 24 is 300 microns in width; the misalignment tolerance is 125 microns in width; the space between second write traces is 75 microns; and the trace-to-trace same-layer pitch is 375 microns. It should be recognized, however, that the dimensions provided above are exemplary only, as other dimensions for the traces 22, 24 may be employed without departing from the scope of the present invention.

Figure 3A:
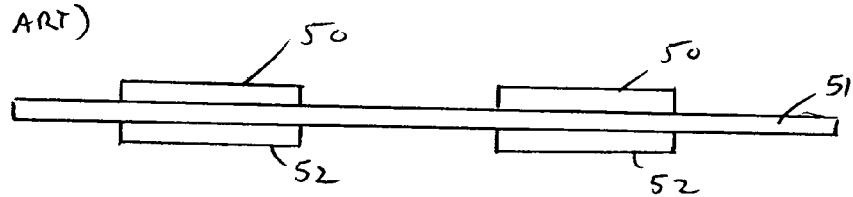
FIG. 3A shows a cross section of a conventional dual layer flexible circuit having an ideal alignment between the trace layers.
Figure 3B:
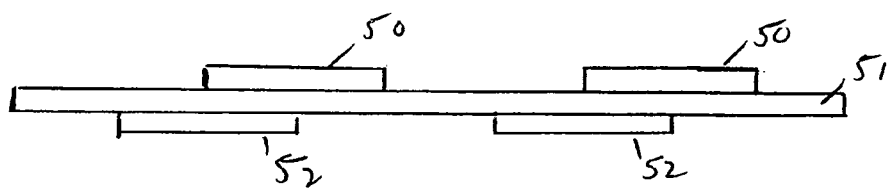
FIG. 3B shows the cross-section of a conventional dual layer flexible printed circuit with misaligned trace layers.

FIG. 5 shows a dual layer flexible printed circuit 14 as in FIG. 4, but one that has been produced with a maximum allowable misalignment between the trace layers. Hence, the first write traces 22 have been shifted over by a maximum allowable misalignment (e.g., 75 microns). Unlike prior arrangements, such as shown in FIG. 3B, the first write traces 22 are completely opposed by the second write traces 24. Hence, the common area between the first and second write traces 22, 24 is kept constant through the full range of misalignment. The present invention therefore maintains the same minimum common area between the first and second write traces 22, 24 of a write trace pair, and the same minimum separation between adjacent write trace pairs can be achieved, using a minimum pitch between the trace pairs.

By using the paired traces on two layers of a flexible printed circuit, a higher capacitance with much lower inductance is produced, in comparison to traditional layouts with write trace pairs on the same trace layer. This lower inductance allows for much faster write current rise time response, enabling the higher system bandwidth and transfer rates needed for high-performance tape drive systems. The present invention, however, avoids the problems caused by variations in the layer-to-layer alignment of the traces in conventional dual layer flexible circuits. Such variations in the alignment between layers produces variations in the capacitance and inductance of the full circuit. In multi-channel tape drives, the multiple pairs of write traces and the layer-to-layer alignment variation presents a challenge in maintaining the low crosstalk between adjacent pairs of write traces.

Although not depicted, those of ordinary skill in the art can recognize that the present invention is applicable to read traces 40, 42, which will also be misaligned like the write traces 22, 24. For some designs, a read trace non-overlap does not present a serious issue, but in other designs, the non-overlap can be a major concern. Hence, in certain embodiments of the invention, the first and second read traces 40, 42 are formed with different widths to accommodate layer-to-layer variation. The dimensions of the read traces 40, 42 can therefore be the same as the write traces 22, 24.

The overcoming of the alignment issue in dual layer flexible printed circuits achieved by the present invention minimizes the effect of layer-to-layer misalignment on the capacity, inductances and crosstalk. As can be seen by the example of a maximally misaligned dual layer flexible printed circuit of FIG. 5, near constant inductance and crosstalk characteristics can be achieved through the full range of layer-to-layer alignment variation. At the same time, a minimum overall width for the flexible circuit is provided.

FIG. 6 depicts an alternate embodiment of the present invention in which the thickness of the first and second write traces 22, 24 are different in order to account for the differences in static resistance caused by the different respective widths of the first and second write traces 22, 24. Hence, the narrower first write trace 22 is made thicker with a thickness of T3 in this embodiment. This greater thickness compensates for the greater width W2 of the second write trace 24, for those embodiments in which a matched resistance between the first and second write traces 22, 24 is desirable.

Although the present invention has been described and illustrated in detail, it is to be clearly understood that the same is by way of illustration and example only and it is not to be taken by way of limitation, the scope of the present invention being limited only by the terms of the appended claims.

What is claimed is:

1. A dual layer flexible circuit for a data recording drive, comprising:
   a flexible substrate having a first side and a second side; and
   a plurality of write trace pairs, each write trace pair including a first write trace on the first side of the substrate and a second write trace on the second side of the substrate opposing the first write trace,
   wherein a width of each second write trace is greater than or equal to a width of each opposing first write trace plus twice an allowed misalignment amount, and
   wherein each second write trace completely overlaps with each opposing first write trace.

2. The flexible circuit of claim 1, wherein each first write trace has substantially the same width as the other first write traces, and each second write trace has substantially the same width as the other second write traces.

3. The flexible circuit of claim 2, wherein the width of each of the first write traces is less than one-third the width of each of the second write traces.

4. The flexible circuit of claim 3, wherein each of the second write traces is separated from an adjacent one of the second write traces by a defined separation distance.

5. The flexible circuit of claim 3, wherein each of the first write traces has a width of approximately 50 microns and each of the second write traces has a width of approximately 300 microns.

6. The flexible circuit of claim 1, wherein each of the first write traces and the second write traces has the same thickness.

7. The flexible circuit of claim 6, wherein the thickness is between about 10 to about 20 microns.

8. The flexible circuit of claim 1, wherein each of the first write traces has a thickness at least twice as great as the thickness of each of the second write traces.

9. The flexible circuit of claim 1, wherein the allowed misalignment amount is not greater than approximately 75 microns.

10. The flexible circuit of claim 1, wherein each of the second write traces is separated from an adjacent second write trace by a defined separation distance, wherein the defined separation distance is equal to the allowed misalignment amount.

11. The flexible circuit of claim 1, wherein the width of each of the second write traces is greater than the width of one of the first write traces plus twice the allowed misalignment amount.

12. A tape drive with a dual layer flexible circuit, comprising:
    a write/read head;
    a dual layer flexible circuit coupled to the write/read head, the flexible circuit including a flexible substrate having a first side and a second side; and
    a plurality of write trace pairs, each write trace pair including a first write trace on the first side of the substrate and a second write trace on the second side of the substrate opposing the first write trace,
    wherein a width of each second write trace is greater than or equal to a width of each opposing first write trace plus twice an allowed misalignment amount, and
    wherein each second write trace completely overlaps with each opposing first write trace.

13. The tape drive of claim 12, wherein each first write trace has substantially the same width as the other first write traces, and each second write trace has substantially the same width as the other second write traces.

14. The tape drive of claim 13, wherein the width of each of the first write traces is approximately one-third the width of each of the second write traces.

15. The tape drive of claim 13, wherein each of the second write traces is separated from an adjacent one of the second write traces by a defined separation distance, wherein the separation distance is approximately equal to the width of each of the first write traces.

16. The tape drive of claim 12, wherein each of the second write traces is separated from an adjacent second write trace by a defined separation distance, wherein the defined separation distance is equal to the allowed misalignment amount.

17. The tape drive of claim 12, wherein the width of each of the second write traces is equal to the width of one of the first write traces plus twice the allowed misalignment amount.

18. The tape drive of claim 13, further comprising a plurality of read trace pairs, each read trace pair including a first read trace on the first side of the substrate and a second read trace on the second side of the substrate opposing the first read trace, each first read trace having a width that is narrower than a width of each second read trace.

19. The tape drive of claim 12, wherein the allowed misalignment amount is not greater than approximately 75 microns.

* * * * *